(12) United States Patent
Hegde et al.

(10) Patent No.: US 7,107,202 B1
(45) Date of Patent: Sep. 12, 2006

(54) METHOD AND APPARATUS FOR HARDWARE AND SOFTWARE CO-SIMULATION

(75) Inventors: Gopal Hegde, San Jose, CA (US); Surendra Rathaur, Milpitas, CA (US); Miguel Guerrero, Union City, CA (US); Anoop Hegde, Sunnyvale, CA (US); Ilango Ganga, San Jose, CA (US); Amamath Mutt, Sunnyvale, CA (US); Simon Sabato, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/495,150

(22) Filed: Jan. 31, 2000

(51) Int. Cl.
*G06F 9/45* (2006.01)

(52) U.S. Cl. .............................. 703/22; 703/13; 703/17; 703/27; 703/28; 714/739; 370/250; 370/252; 370/253; 370/391

(58) Field of Classification Search ................. 703/22, 703/17, 13, 27, 28; 370/250, 252, 253, 391; 714/739
See application file for complete search history.

(56) References Cited

U.S. PATENT DOCUMENTS

| | | | | | |
|---|---|---|---|---|---|
| 5,343,463 | A | * | 8/1994 | van Tetering et al. | 370/253 |
| 5,450,400 | A | * | 9/1995 | Denissen et al. | 370/391 |
| 5,838,948 | A | * | 11/1998 | Bunza | 703/27 |
| 5,870,588 | A | * | 2/1999 | Rompaey et al. | 703/13 |
| 5,960,182 | A | * | 9/1999 | Matsuoka et al. | 703/17 |
| 6,182,258 | B1 | * | 1/2001 | Hollander | 714/739 |
| 6,202,044 | B1 | * | 3/2001 | Tzori | 703/28 |
| 6,212,489 | B1 | * | 4/2001 | Klein et al. | 703/13 |

OTHER PUBLICATIONS

Becker et al., "An Engineering Environment for Hardware/Software Co–Simulation", Proceedings of the 29th ACM/IEEE Conference on Design Automation Conference, 1992, pp. 129–134.*

Bauer et al., "Hardware/Software Co–Simulation in a VHDL–based Test Bench Approach", Proceedings of the 34th Design Automation Conference, Jun. 1997, pp. 774–779.*

Rowson, J., "Hardware/Software Co–Simulation", *31st Design Automation Conference*, San Diego, CA, 4 pgs. (Jun. 6–10, 1994).

* cited by examiner

*Primary Examiner*—Jean R. Homere
*Assistant Examiner*—Herng-der Day
(74) *Attorney, Agent, or Firm*—Blakely, Sokoloff, Taylor & Zafman LLP

(57) ABSTRACT

A method apparatus for hardware and software co-simulation in ASIC development includes developing hardware and software concurrently and co-simulating the hardware and software therebetween via a network while the hardware and software are being developed. The method and apparatus for hardware and software co-simulation allows the software development and testing of hardware and software to start with the design of hardware so as to reduce an overall system development cycle involving ASICs.

9 Claims, 5 Drawing Sheets

METHOD AND APPARATUS FOR HARDWARE AND SOFTWARE CO-SIMULATION

BACKGROUND OF THE INVENTION

1. Field of the Invention

This invention relates in general to the field of Custom Application Specific Integrated Circuit (ASIC) development, and more particularly to a method and apparatus for hardware and software development and simulation/testing in ASIC development.

2. Description of Related Art

Digital systems today are primarily task specific embedded systems that include standard and/or custom hardware and software. Standard hardware may include off-the-shelf microprocessors and memory. Custom hardware is usually implemented as programmable logic devices (PLDs), or Application Specific Integrated Circuits (ASICs). Hardware architecture provides a framework on which the software processes execute. Standard software typically includes a real time operating system (RTOS) and configurable device drivers. Customer software includes embedded applications. The software architecture defines how these processes communicate.

Often, software is executed with a hardware simulator or model, and very often in cooperation with a hardware simulator or model, e.g., a semiconductor chip tester. A hardware prototype is coupled to the hardware simulator or model. The hardware simulator or model provides the hardware architecture with the values on the input pins of a prototype hardware used as a building block in a system. This then drives the values onto the actual input pins of the prototype hardware. The hardware simulator or model can sample the output pins of the prototype hardware and return these values to the hardware simulator.

Traditionally, the hardware and software will not be validated together until at least a prototype of the hardware with sufficient functionality is available. As a result, the software development is generally delayed until final stages of the hardware development of a first prototype. This makes product development cycles too long for today's competitive market.

Also, part of the hardware development requires software functionality to be present to allow proper testing of the hardware. For instance, when developing an ASIC, usually a CPU model, which includes ASIC initializations and maybe another higher level functionality, is written. This higher level functionality is developed for a hardware testing and will later, again, be developed on the software side once the software development starts. As a result, the same tasks are written twice, once for the hardware test by using a high level language (e.g. in Verilog), and once again for the software development by using another high level language (e.g. in C). The translation between the two languages is not straightforward most of the time. In addition, these programs are often developed by different groups with different objectives in mind. Frequently, a system software finds that ASIC does not have the proper functionality after the system has been built. This may require building the ASIC again. Thus, a system development involving ASICs is a lengthy and resource intensive exercise. Further, a high performance multi-function ASIC, such as the Porche switching and routing ASIC system, developed by Level One Communications, Inc., is extremely complex and would require lengthy test and verification cycles. The time-to-market pressure makes it impractical to wait for hardware delivery before starting software development.

Problems in designing a complex hardware circuit board are also similar in nature. Typically, components of a hardware circuit board have to be tested before software development/debugging. Often times, software drivers run into hardware problems, which would require an expensive and time consuming hardware circuit board redesign.

It is with respect to these or other considerations that the present invention has been made.

SUMMARY OF THE INVENTION

In accordance with the present invention, the above and other problems are solved by providing a method and apparatus for hardware and software co-simulation in ASIC development. The present invention allows the software development and testing of hardware and software to start concurrently with the design of hardware so as to reduce an overall system development cycle involving ASICs.

In one embodiment of the present invention, a method of developing an ASIC includes developing hardware and software concurrently. The hardware and software are co-simulated therebetween via a network while the hardware and software are being developed.

Further in one embodiment of the present invention, the method further includes receiving test inputs for the co-simulation from a real world environment, such as an actual IP (Internet Protocol) network having switches, PCs, and routers. Alternatively, the method receives test inputs for the co-simulation from a test tool, such as ANVL from Midnight Networks or Netcom Smartbits systems.

In one embodiment of the present invention, a method of co-simulating hardware and software in ASIC development includes requesting an access to a hardware model from a hardware side to a software side via a network. A function call is invoked by a CPU server at a software side. An access request is sent from the hardware side to the CPU server at the software side via the network. The access request is routed to the hardware model.

In one embodiment of the present invention, an apparatus for hardware and software co-simulation in ASIC development includes a hardware model to represent a hardware board circuit to be co-simulated/tested, the hardware model being developed on a workstation; a software to command and control accesses of the hardware model, the software being developed/debugged on a target board concurrently with a design of the hardware model; and a network, coupled between the workstation and the target board, to communicate command and control information from the software to the hardware model and to route contents of the command between the workstation and the target board.

Further in one embodiment of the present invention, the hardware model includes a CPU bus functional model which communicates between the hardware model and a CPU server of the target board via the network. The software is loaded on the CPU server. The network is an TCP/IP protocol.

Still in one embodiment of the present invention, the hardware model is capable of receiving inputs for simulation from a real working environment, e.g. a real network. Alternatively, the hardware model is capable of receiving inputs for simulation from a test tool, e.g. a protocol conformance test tool.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE PREFERRED EMBODIMENT

The present invention provides a method and apparatus for hardware and software co-simulation in ASIC development. The present invention allows the software development and testing of ASICs to start concurrently with the design of ASICs so as to reduce an overall system development cycle involving ASICs. The method and apparatus for hardware and software co-simulation in accordance with the principles of the present invention enables software development and debugging to start well before an actual ASIC hardware is available. Also, the present invention can be used for a board design as well as an ASIC design. In addition, the present invention provides a mechanism for testing and verification for an actual hardware and ASICs in a real world environment well before an actual hardware is available. Further, the present invention can be used to demonstrate actual hardware product capabilities to potential customers/sales/marketing people well before an actual hardware is available.

Before describing in detail a particular embodiment of a method and apparatus for hardware and software co-simulation in accordance with the present invention, it should be understood that other embodiments may be utilized as structural changes may be made without departing from the scope of the present invention, and that the present invention resides primarily in a novel structural combination of conventional signal processing and communication circuits and components and not in the particular detailed configurations thereof. Accordingly, the structure, arrangement, and control of these conventional circuits and components have been illustrated in drawings by readily understandable block diagrams which show only those specific details that are pertinent to the present invention, so as not to obscure the disclosure with structural details which will be readily apparent to those skilled in the art having the benefit of the description herein. Thus, the block diagram illustrations of the figures do not necessarily represent the electrical or mechanical structural arrangement of an exemplary system or circuitry, but are primarily intended to illustrate the major structural components of the system or circuitry in a convenient functional group, so that the present invention may be more readily understood.

Figure 1:
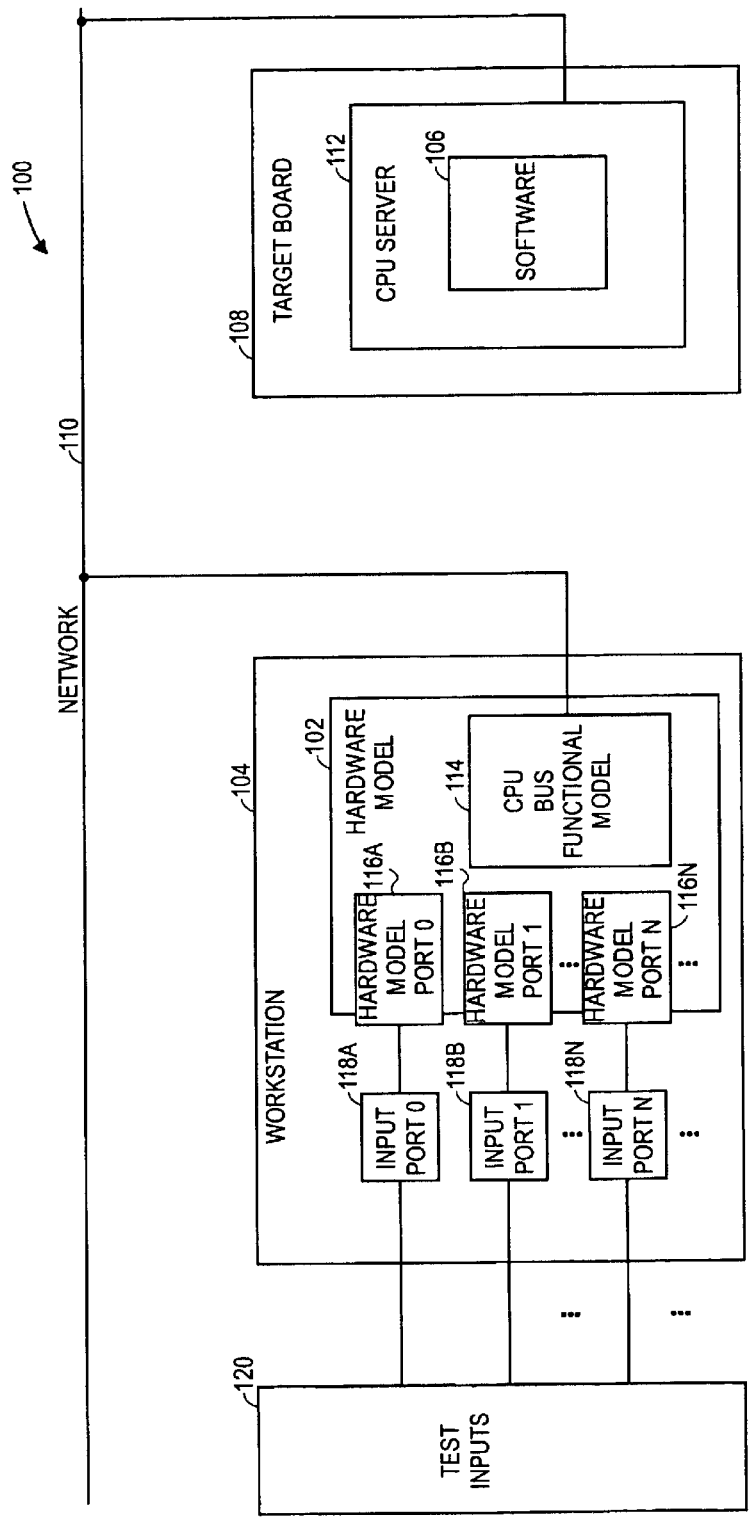
FIG. 1 illustrates a block diagram of one embodiment of a hardware and software co-simulation apparatus in ASIC development in accordance with the principles of the present invention.

In FIG. 1, a hardware and software co-simulation apparatus 100 in ASIC development in accordance with the principles of the present invention includes a hardware model 102 presenting a hardware board circuit which is an actual hardware board circuit. The hardware model 102 can be developed on a workstation 104, such as a Unix workstation. The hardware model 102 is described in a high-level description language, such as Verilog (see FIG. 4), HDSL, etc., which is synthesizable. For example, an actual hardware having logic gates can be generated automatically using a Verilog model. A hardware model 102 may contain register sets and state machines that describe the behavioral and functional characteristics of an actual hardware board circuit.

The co-simulation apparatus 100 also includes a software 106 which programs and drives the hardware model 102. A target board 108 can be used as a platform for software development, and the software 106 runs on the target board 108. The target board 108 can be used as a platform for the actual hardware on which the ASIC, when it is fabricated, will sit. It is appreciated that other software development environment, such as IBM PC or Sun workstation, can be used to develop the same software 106. The software development platform may require an TCP/IP socket environment. In Microsoft® Windows-95 or Windows-98 or Windows-NT machines, an TCP/IP socket environment is provided through winsock. In a Unix system, TCP/IP sockets are generally integrated into its operating system (OS).

The target board may be an actual hardware circuit board. In such a case, an actual target processor can be used to run the codes of the software 106. If the actual hardware board is not ready, a demo system including a target CPU server can be used. This allows the simulated hardware model 102 to use a target real time operating system (RTOS) during the software development. On the other hand, if a demo system is used, e.g. a PC or a Sun workstation, the software 106 can be compiled to its native processor, and system function calls can be remapped to a target operating system. It is appreciated that in any case, all the accesses to an actual hardware, e.g. ASIC registers, or an ASIC memory, etc., are made through function calls. These function calls can be encapsulated as TCP/IP socket calls.

Figure 4:
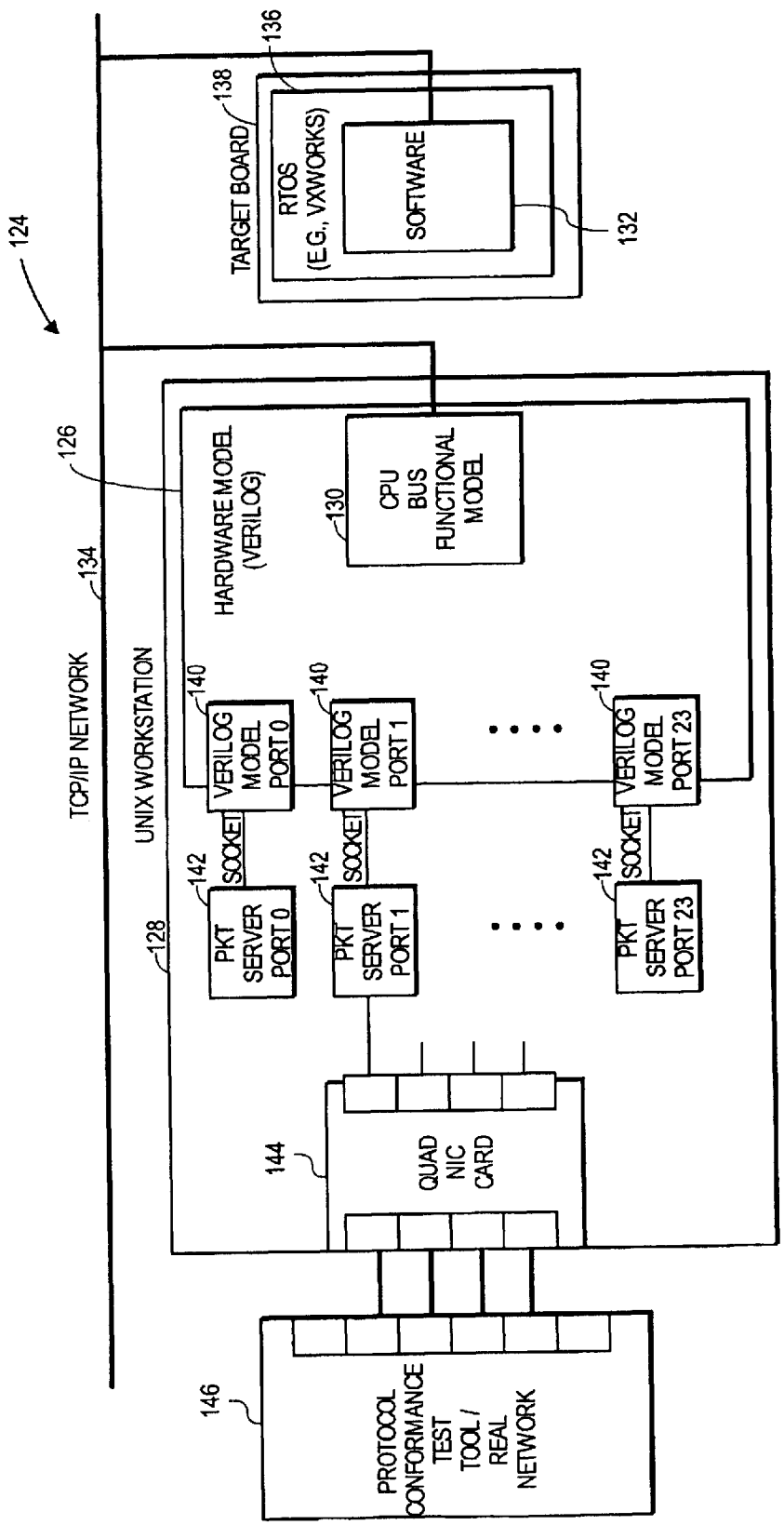
FIG. 4 illustrates a block diagram of one embodiment of a hardware and software co-simulation apparatus in ASIC development of a data packet switching and routing system in accordance with the principles of the present invention.

The co-simulation apparatus 100 further includes a network 110 coupled between the workstation 104 and the target board 108. The network 110 preferably uses an TCP/IP protocol. The network 110 communicates the command and control information of the software 106 to the hardware model 102 and routes the contents of the command between the workstation 104 and the target board 108. In one embodiment as shown in FIG. 4, the TCP/IP protocol is used for communication between a Verilog hardware model through a programming language interface (PLI) and a target board which runs a driver software. The driver software controls the operation of the hardware. The hardware and software co-simulation is preferably configured in an TCP/IP client/server model. The software side is the server side, and the hardware side is the client side. Accordingly, whenever a memory access function is invoked, the TCP/IP sockets are used to communicate with a CPU server 112 of the target board 108 at the software side. The software 106 is run on the CPU server 112.

Also in FIG. 1, the hardware model 102 includes a CPU bus functional model 114 which communicates the hardware model 102 to the CPU server 112 of the target board 108 via the network 110. The hardware model 102 is capable of receiving inputs 120 for simulation from a real network (FIG. 4). Alternatively, the hardware model 102 is capable of receiving inputs for simulation from a test tool, such as a protocol conformance test tool (FIG. 4). A real network or a test tool is generally used to study how the hardware model 102 behaves under the different operating conditions. For example, in a data packet switching and routing system, real data packets from the network or simulated data packets from a test tool can be fed into input ports 116A, 116B, . . . 116N of the hardware model 102. The outputs of the hardware model 102 can be studied under various real working environments or test conditions to ensure that the hardware works well, before an actual hardware or a hardware subsystem is built. The present invention provides for much more realistic and extensive test coverage. Also, when the packets are generated from external sources including actual networks, the testing can be much faster and less error prone than the testing when the packets are generated from internal sources. Further, the workstation 104 may include input ports 118A, 118B, . . . 118N to interface between the real working environment/test tool and the hardware model 102 to receive test inputs 120.

In FIG. 1, communications across the network 110 and within the hardware model 102, e.g. Verilog environment, may use an XBUS protocol. Generally, the XBUS protocol is a mechanism defined to share messages between modules in a simulated environment, such as a Verilog environment. The same mechanism can be used to share messages between Unix/TCP/IP sockets and the Verilog environment. The XBUS was originally defined as a 32-bit bus (with 32-bit data and one Valid signal), which passes messages using a terahertz clock, so that messages can be exchanged in near zero time. However, this traditional XBUS mechanism increases the simulation time because the data is physically transferred over the bus. Also, it becomes cumbersome to include this traditional XBUS in a system level simulation environment, since the 32-bit bus needs to physically connected between modules.

One embodiment of an XBUS in the present invention uses a new mechanism which is defined to exchange data without using a physical bus, even though the old name XBUS is still used. The new mechanism of the XBUS includes a module at the top level which has registers where a message header and data are stored. All the modules that use this XBUS share these registers to exchange messages among them. This allows the hardware and software to share/exchange messages with a single format.

The XBUS uses an arbitration system called "tickets" because it can work like the tickets at a Deli restaurant. Basically, one pulls a ticket and waits for the number to be called. When a module, for example, an TCP/IP interface, wants to send a message, the module grabs a ticket and waits for its number to become current. Since messages take one simulation time unit to send, usually there is no wait. The module copies the message header and data and toggles a register called "XmessageSignal". All other XBUS clients or modules see this, compare the destination address with its own and ignore or act on the message.

The XBUS used in the present invention has a message format generally described above. The message format is used to signal events such as "Packet", "CPU Read", and "Acknowledge", etc. The hardware model 102 may communicate by using a XBUS type message format and respond to messages, such as "Packet", by generating appropriate hardware signals to the simulated hardware. When a packet is generated by the simulated hardware, or data from a CPU read operation is available, the packet or data is captured and sent as an XBUS message out of the hardware model 102 and into the network 110. In an example of a Verilog environment, it is appreciated that although the Verilog environment may be natively support message based communications, significant benefits in the reuse of the hardware model between the ASIC and co-simulation environments are achieved by implementing the XBUS type of message passing methods. Verilog modules in a hardware model are assigned with addresses. An XBUS message board is visible to all modules in the simulation, and each can arbitrate for access to the board in order to post a message.

Accordingly, the present invention provides a dual interface mode. One is for actual data packet processing, and the other one is for command and control operations. Also, the present invention provides a mechanism to actually process data packets just like the real hardware. These data packets can be packets generated from standard packet generators or protocol conformance test tools. The data packets can also be actual network traffic or a real working environment. In addition, the present invention allows to demonstrate and study realistically the capabilities of the hardware well before an actual hardware is available.

Further, the present invention allows to mix virtual hardware (i.e. ASIC under development) with already existing hardware (i.e. demo board with a particular processor). This characteristic eases the development of a system hardware model thereby allowing the use of real components when their models are unavailable, too expensive, or require too much modeling time.

Furthermore, the present invention allows to run the software on a real target board or a demo board with a target CPU thereby making co-simulations much faster than the ones based on soft CPU models, especially in tasks that do not require interaction with a virtual hardware (e.g. OS boot).

Moreover, the present invention allows to reuse most of the hardware model, e.g. Verilog model, etc., from the ASIC design and test environment, which may be completely Verilog based. Since both the ASIC and co-simulation environments utilize the common XBUS protocol, the fundamental difference between the ASIC and co-simulation environments is whether XBUS messages are generated and checked by a hardware model, e.g. a Verilog model, or whether they are transmitted through an TCP/IP network to the data packet server (i.e. the server which controls the input data packets) and the control/command CPU server (i.e. the CPU server which runs the software on the target board).

Figure 2:
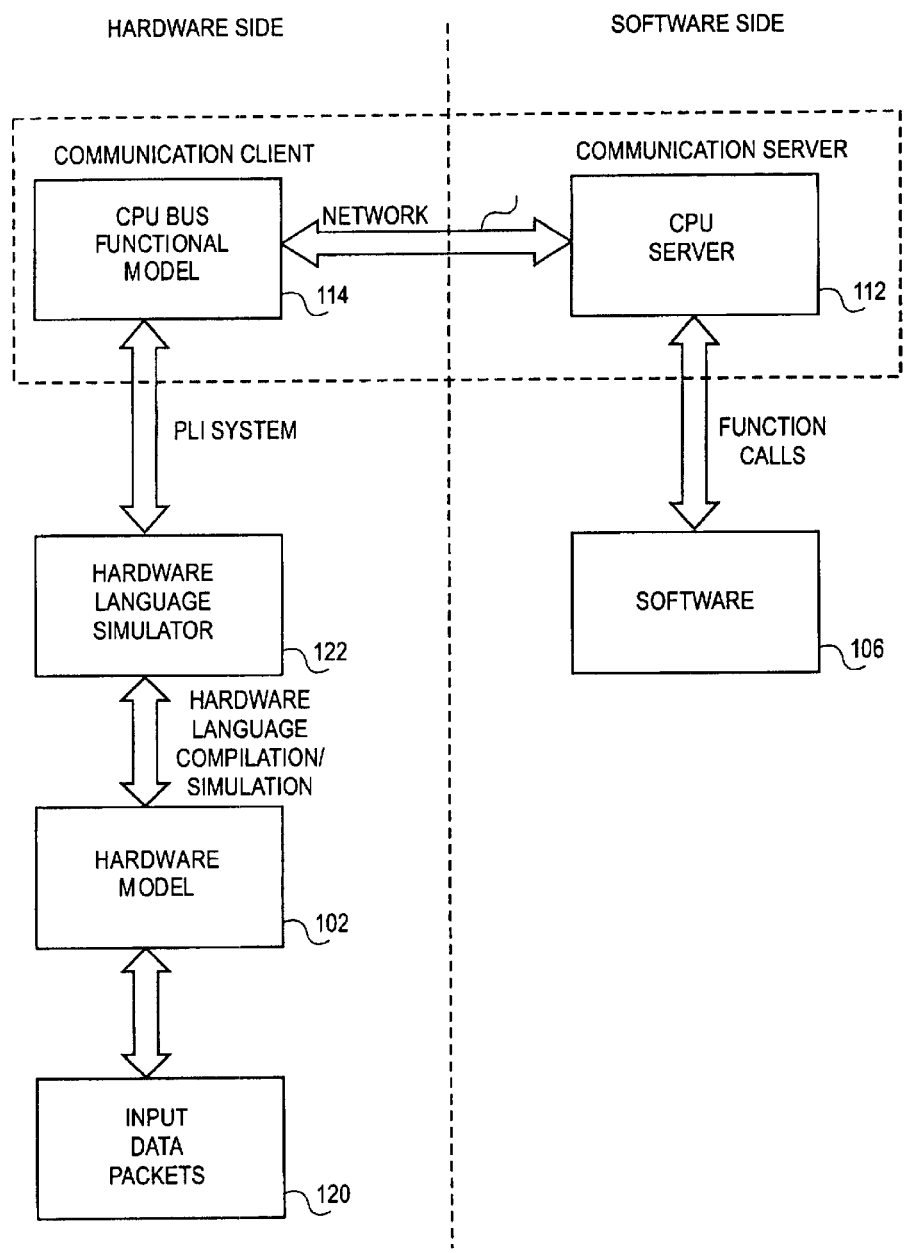
FIG. 2 illustrates a flow diagram of one embodiment of a hardware and software co-simulation apparatus in ASIC development in accordance with the principles of the present invention.

In FIG. 2, a flow diagram of one embodiment of the hardware and software co-simulation apparatus 100 in ASIC development, in accordance with the principles of the present invention, is illustrated. The hardware and software are developed concurrently. On the hardware development side, the CPU bus functional model 114 interfaces with a hardware language simulator 122, e.g. a Verilog based simulator, to simulate the hardware model 102. Data packets 120 are input into the hardware model 102.

Also in FIG. 2, on the software development side, the control/command software 106 is run on the CPU server 112. During the development of the hardware model 102 and the software 106, either under a real network or under a test tool, functions can be called by the software 106 when data packets are input. In the case of a data packet switching and routing system, accesses to the hardware model are made through function calls. The function calls are encapsulated as TCP/IP network socket calls. When an ASIC data structure or memory is read to be accessed, function calls that use TCP/IP network sockets are used to communicate with the CPU server. If the command is to read a memory location, a READ function is called to send the address of the location to be read to the CPU server which in turn feeds it to the hardware model, e.g. a Verilog model. The data is then read, and the function call is returned to the software. If the command is to write a location, a WRITE function is called to send the address of the location and the value to be written to the CPU server which in turn feeds it to the hardware model, e.g. a Verilog model. The location/register then gets written, and the function call is returned to the software. In both cases, the software running on the development platform initiates the communication.

In a real time system, asynchronous events can arrive as interrupts. An interrupt handler (not shown) waits for an event. A server for data packets at the hardware side initiates the communication. One of the events is to send a data packet to the CPU server at the software side. The interrupt handler invokes a process to read the data packet. Another event is to send an interrupt to the CPU server at the software side to indicate error conditions, status change conditions, or unresolved flow entries, etc. The interrupt handler invokes appropriate software processes at the software side to handle these conditions.

Figure 3:
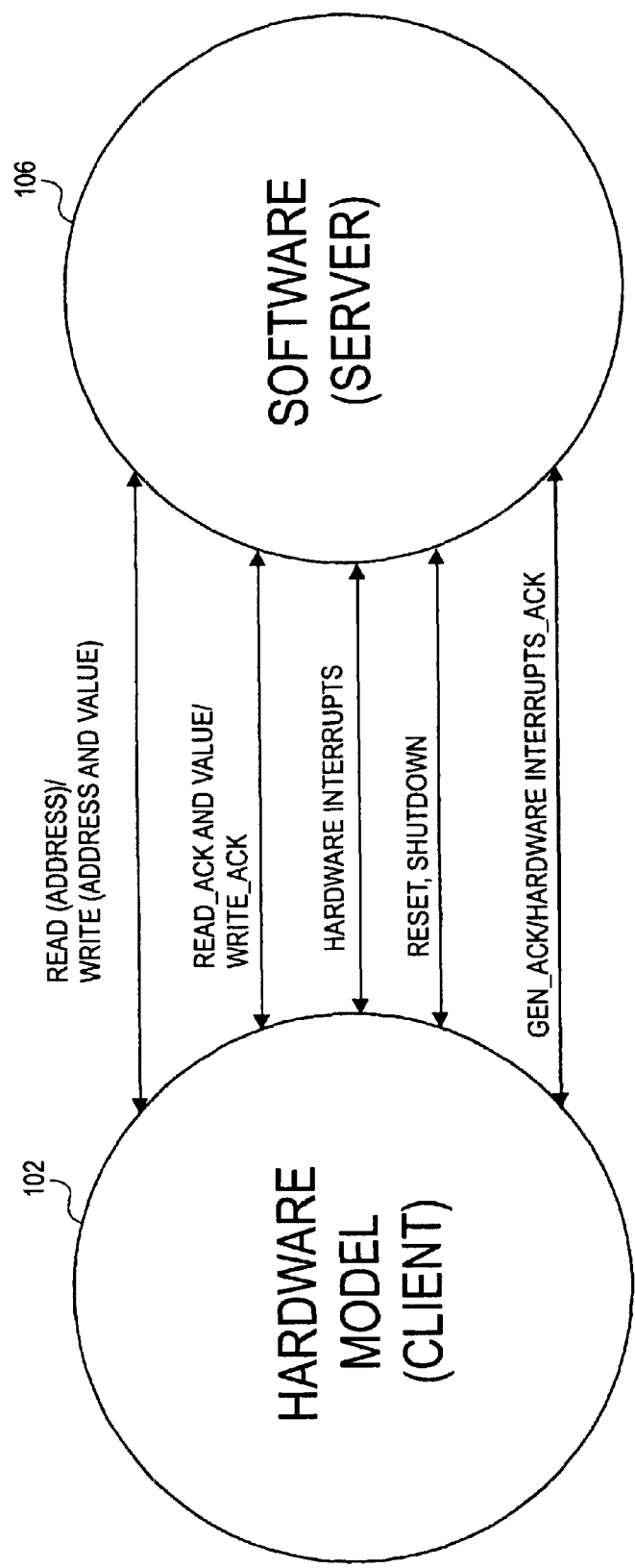
FIG. 3 illustrates a state diagram of one embodiment of hardware and software co-simulation operations in ASIC development in accordance with the principles of the present invention.

In FIG. 3, a state diagram of one embodiment of hardware and software co-simulation operations in ASIC development, in accordance with the principles of the present invention, is illustrated. In addition to read/write processes, the hardware and software can be co-simulated and tested in other processes, such as hardware interrupts, reset, shutdown, and acknowledgment of the READ/WRITE processes, etc. It will be appreciated that other functions/processes can be called while the hardware and software are being developed concurrently.

In FIG. 4, a hardware and software co-simulation apparatus 124 is implemented in the ASIC development of a specific data packet switching and routing system. An actual hardware is described in a Verilog model 126. The Verilog model 126 is run on a Unix workstation 128. The hardware model 126 includes a CPU bus functional model 130 which communicates with a driver software 132 via an TCP/IP network 134. The software 132 is run on a CPU server 136 with a real time operating system (RTOS) of a target board 138.

Also in FIG. 4, the Verilog model 126 includes a plurality of Verilog model ports 140, each of which interfaces with a data packet server 142 port.

Further, in FIG. 4, a network interface card (NIC) 144 is included in the Unix workstation 128. The data packet server 142 monitors the NIC 144 and waits for the NIC 144 to feed actual data packets that need to be switched or routed by the Verilog model 126. It can also be manually operated to generate packets of various types.

The Verilog model 126 also provides an interface for external software programs written in high level language such as C programming language to access internal registers of the Verilog model 126. This interface is often referred to as a programming language interface (PLI). As shown, the data packet server 142 provides an interface between an external driver and the Verilog model 126. The data packet server 142 also polls the Verilog model 126. When the data packet server 142 has a packet that needs to be forwarded by the Verilog model 126, the data packet server 142 sends the packet out. Further, for the testing/debugging the hardware and software, data packets can be generated via a real network/protocol conformance test tool 146 and sent to the Verilog model 126.

Also in FIG. 4, the data packet switching and routing system 124 uses a memory interface to communicate with the control and command interface of the CPU server 136. This memory interface can be simulated by providing the CPU bus functional model 130 on the Unix workstation. The target board 138 runs the driver software 132. The Verilog model 126 uses this interface to send asynchronous events to the driver software 132 or to receive commands and configuration information from the driver software 132 running on the target board 138. Asynchronous events processed by the software 132 include the arrival of data packets that are addressed to a switch, error conditions need to be handled, the first data packet for a flow for which an entry needs to be created in a memory for storing the data packets, etc. The memory for storing the data packets can be a SRAM or any other suitable memory (not shown).

The NIC 144 can be used for a packet interface for switching and routing input data packets. The data packet server 142 monitors the NIC 144. Data packets are received from external sources 146, such as a software packet generator, a protocol conformance test tool (e.g. ANVL from Midnight Networks), a standard test tool (e.g. Netcom Smartbits packet generator or Wandell & Golterman packet generator), or an actual network traffic. Data packets received by the NIC 144 are fed to the data packet server 142. These data packets are then forwarded to the Verilog model 126. The data packets are then switched or routed by the Verilog model 126 controlled by the software 132. The data packets may also be sent to the external sources (not shown) through the NIC 144. The NIC 144 represent multiple switching and routing ports of a switch. It is appreciated that other ASICs can be developed within the scope of the present invention. For example, an ASIC development for an ATM switch which has a multi-port ATM card.

Figure 5:
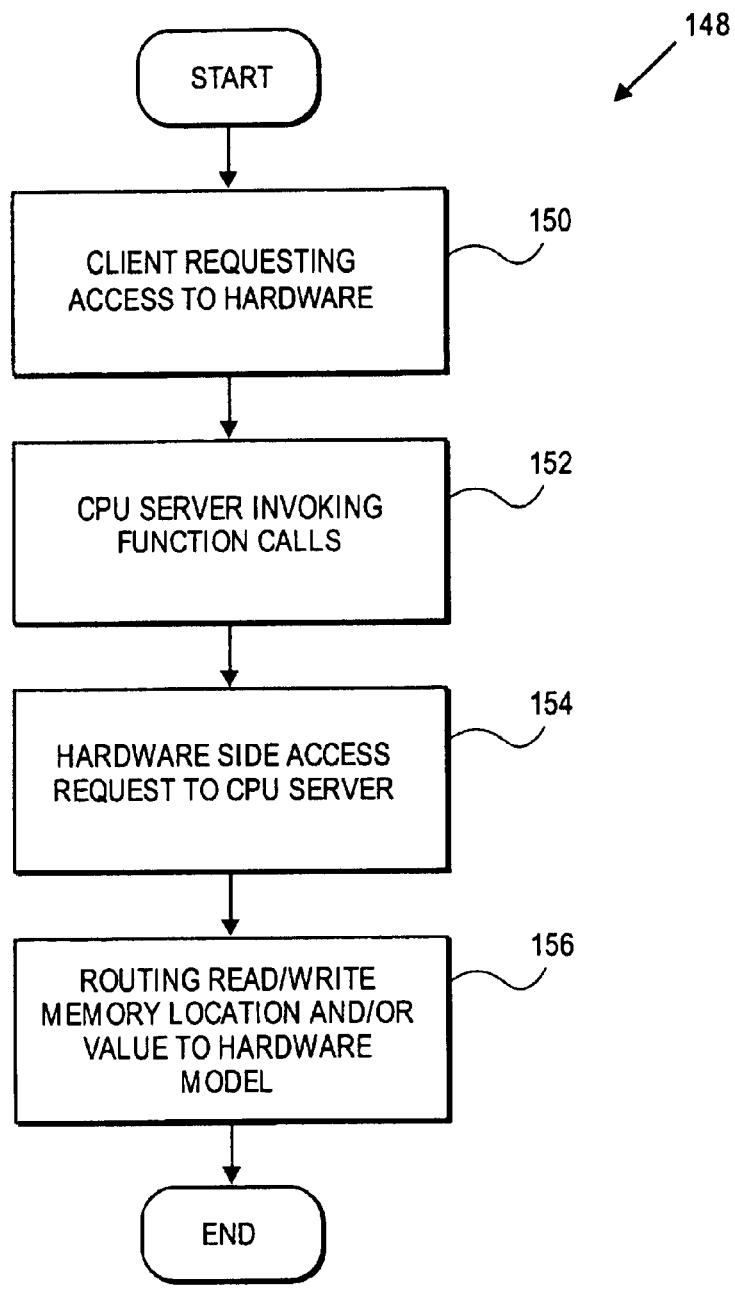
FIG. 5 illustrates a flow chart of one embodiment of hardware and software co-simulation operations in ASIC development of a data packet switching and routing system in accordance with the principles of the present invention.

In FIG. 5, an operational flow 148 of one embodiment of hardware and software co-simulation in ASIC development, in accordance with the principles of the present invention, starts with an operation 150 of requesting an access to a hardware model from a hardware side to a software side. Then, a function call is invoked by a CPU server at a software side in an operation 152. Next, an access request from the hardware side is sent to the CPU server at the software side in an operation 154. Then, the access request is routed to the hardware model in an operation 156.

It is appreciated that other co-simulation/testing operations can be performed between the hardware side and the software side via a network while the hardware and software are being developed concurrently without departing from the scope of the present invention. For example, an interrupt process can be invoked in the hardware and software co-simulation.

The foregoing description of the exemplary embodiment of the invention has been presented for the purposes of illustration and description. It is not intended to be exhaustive or to limit the invention to the precise form disclosed.

Many modifications and variations are possible in light of the above teaching. It is intended that the scope of the invention be limited not with this detailed description, but rather by the claims appended hereto.

What is claimed is:

1. A method of developing an ASIC comprising:
    developing a hardware model including a CPU bus functional model, and a software loaded on a CPU server concurrently;
    communicating command and control information between the CPU server and the CPU bus functional model over a network according to an XBUS protocol modified to exchange data for all modules using the XBUS protocol by sharing a plurality of registers and without using a physical bus;
    co-simulating the hardware model and the software; and
    receiving real working environment test inputs for the co-simulation.

2. The method of claim 1, wherein the hardware model is developed on a workstation.

3. The method of claim 1, wherein the software is developed on a target board.

4. The method of claim 1, wherein the co-simulated hardware model is described by a high-level language model.

5. A method of co-simulating a hardware model and a software in ASIC development, comprising:
    Requesting, by a hardware side including a hardware model and a CPU bus functional model, access to a software side including a software loaded on CPU server over a network according to a modified XBUS protocol to exchange data for all modules using the XBUS protocol by sharing a plurality of resisters and without using a physical bus;
    invoking a function call by the CPU server;
    sending an access request from the CPU bus functional model to the CPU server over the network according to the modified XBUS protocol;
    routing the access request to the hardware model;
    co-simulating the hardware model and the software; and
    receiving real working environment test inputs for the co-simulation.

6. The method of claim 5, wherein the function call is a READ function call.

7. The method of claim 5, wherein the function call is a WRITE function call.

8. The method of claim 5, further comprising:
    requesting a hardware model interrupt; and
    handling the hardware model interrupt with a function call invoked by the CPU server over the network.

9. An apparatus for hardware model and software co-simulation in ASIC development, comprising:
    a hardware model including a CPU bus functional model to represent a hardware board circuit;
    a software to load on a CPU server to provide command and control access of the hardware model;
    a network coupled to the CPU bus functional model and the CPU server to communicate a command from the software to the hardware model and to route contents of the command between the hardware model and software according to a modified XBUS protocol to exchange data without using a physical bus to provide co-simulation of the hardware model and software; and
    a plurality of shared registers coupled to the hardware model and the software, the shared registers configured to communicate according to the modified XBUS protocol
    wherein the hardware model is configure to receive real working environment test inputs for the co-simulation.

* * * * *